(12) United States Patent  (10) Patent No.: US 7,875,901 B2
Fujino et al.  (45) Date of Patent: *Jan. 25, 2011

(54) OPTICAL DEVICE PACKAGE AND OPTICAL SEMICONDUCTOR DEVICE USING THE SAME

(75) Inventors: Junji Fujino, Tokyo (JP); Hideyuki Tanaka, Tokyo (JP); Kenzo Mori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/574,718

(22) Filed: Oct. 7, 2009

(65) Prior Publication Data

US 2010/0020839 A1    Jan. 28, 2010

Related U.S. Application Data

(63) Continuation of application No. 11/686,443, filed on Mar. 15, 2007, now Pat. No. 7,622,750.

(30) Foreign Application Priority Data

Mar. 28, 2006 (JP) .............................. 2006-087953
Dec. 22, 2006 (JP) .............................. 2006-346631

(51) Int. Cl.
H01S 5/026 (2006.01)
H01S 5/022 (2006.01)
H01S 5/02 (2006.01)
H01L 33/00 (2010.01)
H01L 23/48 (2006.01)
H01L 31/00 (2006.01)
G11B 7/125 (2006.01)

(52) U.S. Cl. .......... 257/99; 257/E33.056; 257/E33.057; 257/E33.058; 257/100; 257/98; 257/687; 257/678; 257/701; 257/684; 257/79; 257/734; 257/81; 372/50.1

(58) Field of Classification Search ................... 257/99, 257/E23.056, E33.057, E33.058, 100, 98, 257/687, 678, 701, 684, 784, 79, 734, 81; 372/50.1
See application file for complete search history.

(56) References Cited

U.S. PATENT DOCUMENTS 5,614,735 A    3/1997 Kitamura et al.
(Continued)

FOREIGN PATENT DOCUMENTS

JP    04-280487 A    10/1992
(Continued)

*Primary Examiner*—Alexander O Williams
(74) *Attorney, Agent, or Firm*—Leydig, Voit & Mayer, Ltd.

(57) ABSTRACT

An optical device package comprises: a metal frame including a substrate and a rectangular die pad portion integrally connected to the substrate, wherein the substrate is a metal plate, and the die pad portion is bent from the substrate such that the die pad portion extends from the substrate at an angle of 90 degrees; signal lead pins extend in the opposite directions from the die pad portion relative to the substrate such that the first lead pins intersect the principal surfaces of the substrate at a right angle and are spaced apart from the metal frame; and a molded resin member including a plate-like resin base extending across and in contact with one of the principal surfaces of the substrate, wherein the signal lead pins protrude from a surface of the resin base; surfaces of the signal lead pins are covered with the molded resin member; and the metal frame and the signal lead pins are secured in place by the molded resin member.

4 Claims, 6 Drawing Sheets

U.S. PATENT DOCUMENTS

| | | |
|---|---|---|
| 6,274,924 B1 | 8/2001 | Carey et al. |
| 6,970,486 B2 * | 11/2005 | Nakata ........................ 372/36 |
| 7,075,178 B2 | 7/2006 | Yamamoto |
| 2003/0108073 A1 | 6/2003 | Nishiyama |
| 2003/0147436 A1 | 8/2003 | Yagi et al. |
| 2003/0178711 A1 | 9/2003 | Honda et al. |
| 2003/0231673 A1 | 12/2003 | Uchida et al. |
| 2004/0071174 A1 | 4/2004 | Takemori |
| 2004/0089865 A1 | 5/2004 | Arthur et al. |
| 2005/0286581 A1 | 12/2005 | Shinohara et al. |
| 2007/0063212 A1 | 3/2007 | Watanabe et al. |
| 2007/0248133 A1 | 10/2007 | Shinohara et al. |

FOREIGN PATENT DOCUMENTS

| | | |
|---|---|---|
| JP | 07-335980 A | 12/1995 |
| JP | 2002-368323 A | 12/2002 |
| JP | 2004-311707 A | 11/2004 |

* cited by examiner

OPTICAL DEVICE PACKAGE AND OPTICAL SEMICONDUCTOR DEVICE USING THE SAME

BACKGROUND OF THE INVENTION

1. Field of the Invention

The present invention relates to an optical device package and an optical semiconductor device using the same, and more particularly to an optical device package to mount an optical device used especially in electronic information devices and information communication devices to transmit and receive high frequency signals, and an optical semiconductor device using the same.

2. Description of the Related Art

In recent years, as broadband optical communications and public telecommunication networks using optical fibers have become widely used, there has been an increasing need to transmit a large amount of information at low cost. This means that electronic information devices for such communications and networks must handle a huge amount of information. That is, these electronic information devices must be reliable and low in cost, yet capable of processing a large amount of data at high speed.

Semiconductor laser devices, which are a major component of electronic information devices, are also required to be low in cost and capable of efficiently generating an oscillation at high power.

Further, recent years have seen an increasing need for DVD-R/RW drives, which are one of the high speed, high capacity storage devices. DVD-R/RW drives employ a high power semiconductor laser, and efforts have been made to develop a high efficiency, high power semiconductor laser formed of an AlGaInP/GaAs material in order to process information at high speed. An optical semiconductor device employing such a semiconductor laser must be adapted to meet requirements such as stable performance at high power operation, low cost, and high efficiency.

The semiconductor laser used in an optical semiconductor device is mounted in a can package having a coaxial configuration (a low-cost configuration) to provide reduced cost. Even such a can package must have a configuration that allows for easy mounting and provides good heat dissipation characteristics, stable optical characteristics, and reduced high frequency signal transmission loss during operation.

The main body of the can package is referred to as the "stem," and includes: a metal disc called an "eyelet"; a plurality of rod-shaped lead electrodes for carrying electrical signals disposed to extend through a plurality of through-holes formed in the eyelet, or metal disc (the through-holes being hermetically sealed with a seal glass); and a mount called a "block" disposed on a disc surface of the eyelet, or metal disc, and configured to have an optical device bonded thereto.

Plastic or resin molded semiconductor laser devices employing such a can package have been proposed which provide reduced manufacturing cost and increased freedom in designing their shape.

A first known plastic molded semiconductor laser device (an example of a plastic molded package) includes arc-shaped portions internally tangent to a virtual circle centered at the point of light emission of the laser diode (or LD) chip. This semiconductor laser device can be fitted and fixed into the stepped receiving hole of a device in the same manner as can-type semiconductor laser devices. (See, e.g., paragraphs [0021] and [0022] and FIG. 2 of Japanese Laid-Open Patent Publication No. 7-335980.)

A second known plastic molded semiconductor laser device is constructed such that: the laser element is mounted on a lead frame perpendicularly protruding from the center portion of a flat surface of the cylindrical plastic base; and the side portions of the lead frame are reinforced with their respective resin members molded thereon, each resin member having a vertically symmetrical shape. This configuration provides increased design freedom, reduced cost, reduced thermal deformation, and hence a reduced amount of shift of the point of light emission during laser operation. (See, e.g., paragraphs [0010], [0021], and [0035] and FIG. 1 of Japanese Patent Publication No. 3607220.)

A third known plastic molded semiconductor laser device includes: a metal eyelet member including an eyelet base portion having a semicircular shape as viewed in plan and an element mounting portion integrally formed with the eyelet base portion, wherein the element mounting portion protrudes from the eyelet base portion; and a lead pin unit including two (signal) lead pins and one ground lead pin and plastic molded components such as projections, a flat plate portion, and a lead support portion, wherein the projections are engaged in the eyelet member, wherein the flat plate portion is joined to an inner edge surface of the eyelet base portion, and wherein the lead support portion supports and holds the lead pins in place. The eyelet member and the lead pin unit are separately manufactured and then assembled together. This configuration enhances heat dissipation from the eyelet member, allowing for accommodation of a high power LD and accurate alignment of the optical axis. Further, since the lead pin unit is molded of a resin and the (signal) lead pins and the ground lead pin in the lead pin unit are supported by the lead support portion, these lead pins can be prevented from bending during transportation of the lead pin unit. (See, e.g., paragraphs [0010], [0014], and [0027] and FIG. 1 of Japanese Laid-Open Patent Publication No. 2004-311707.)

However, each of the above configurations has disadvantages. In the case of the first known plastic molded semiconductor laser device, the above-described arc-shaped portions (which constitute protrusions protruding from the die pad portion) may be difficult to reliably form to a desired shape, although they are compatible with conventional can packages. That is, this configuration only provides for an improved lead frame.

In the case of the second known plastic molded semiconductor laser device, the resin base (corresponding to the eyelet of a conventional can package) is formed by a simple resin molding process, which is advantageous. However, a resin mold (or resin eyelet) has lower thermal conductivity than a metal eyelet. Therefore, this semiconductor laser device may exhibit degraded heat dissipation characteristics and, furthermore, degraded optical characteristics due to the shift of the point of light emission caused by thermal deformation at high temperatures if it employs a high power LD, which has become widely used in recent years.

In the case of the third known plastic molded semiconductor laser device, the (signal) lead pins and the ground lead pin are supported by the lead support portion molded of a resin. Therefore, most of the entire lengths of these (signal) lead pins and ground lead pin is covered and sealed with the resin lead support portion; only their tip portions are exposed. This configuration results in an increased distance between the LD chip and the grounding layer on the surface of the resin substrate (on which the LD chip is mounted), leading to increased inductance and hence increased transmission loss at high frequencies. This adversely affects the laser output characteristics, which may make it difficult for the semiconductor laser device to achieve good high frequency characteristics.

SUMMARY OF THE INVENTION

The present invention has been devised to solve the above problems. It is, therefore, a first object of the present invention to provide a low-cost optical device package that has good high frequency characteristics and exhibits reduced degradation in optical characteristics during operation of the device. A second object of the present invention is to provide a low-cost optical semiconductor device that has good high frequency characteristics and exhibits reduced degradation in optical characteristics during operation.

According to one aspect of the present invention, there is provided an optical device package comprises: a metal base having a substrate with a predetermined outer shape and a die pad portion integrally connected to the substrate, the substrate and the die pad portion being constructed of a metal plate, the substrate having two principal surfaces, and the die pad portion being bent at a predetermined angle to the principal surfaces of the substrate; a first lead electrode intersecting the principal surfaces of the substrate of the metal base at a predetermined angle, being apart from the metal base, and each end of the first lead electrode protruding from a respective one of the principal surfaces of the substrate; and a resin seal member having a plate-like base portion extending across and in close contact with one of the principal surfaces of the substrate of the metal base, the first lead electrode in the opposite direction as the die pad portion relative to the substrate protruding from the base portion, the resin seal member covering the first lead electrode in the same direction as the die pad portion relative to the substrate leaving a exposed surface portion, and securing the metal base and said first lead electrode.

Accordingly, in the optical device package according to the present invention the metal base including the die pad portion has good heat dissipation characteristics, resulting in reduced degradation of the optical characteristics of the optical device during operation. Further, since the base portion of the resin seal member has a plate-like shape and the first lead electrodes protrude from a surface of this base portion of the resin seal member, the optical device package can be mounted on a mounting substrate such that the mounting substrate is in close contact with the surface of the base portion of the resin seal member. This reduces the distance between the mounting substrate and the optical device mounted on the die pad portion of the metal base, resulting in enhanced high frequency characteristics. Further, this optical device package can be manufactured at low cost, since it employs a resin mold, or a resin seal member.

According to another aspect of the present invention, there is provided an optical semiconductor device comprises: an optical device package including; a metal base having a substrate with a predetermined outer shape and a die pad portion integrally connected to the substrate, the substrate and the die pad portion being constructed of a metal plate, the substrate having two principal surfaces, and the die pad portion being bent at a predetermined angle to the principal surfaces of the substrate, a first lead electrode intersecting the principal surfaces of the substrate of the metal base at a predetermined angle, being apart from the metal base, and each end of the first lead electrode protruding from a respective one of the principal surfaces of the substrate, and a resin seal member having a plate-like base portion extending across and in close contact with one of the principal surfaces of the substrate of said metal base, said first lead electrode in the opposite direction as the die pad portion relative to the substrate protruding from the base portion, the resin seal member covering the first lead electrode in the same direction as the die pad portion relative to the substrate leaving a exposed surface portion, and securing the metal base and the first lead electrode; and a semiconductor laser device mounted on a mount disposed on the surface of the die pad portion of the metal base, and having predetermined electrodes electrically connected to the first lead electrodes or both the first and second lead electrodes.

Accordingly, the optical semiconductor device is low in cost, yet exhibits good characteristics and reduced transmission loss at high frequencies since the optical device package contribute to enhancing characteristics of this optical semiconductor device.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

Although the present invention will be described with reference to LD packages (a representative optical device package) and LD devices, the invention may be applied to photodetectors and other light-emitting devices.

The following description of a preferred embodiment of the present invention will be directed in particular to LD devices that employ an optical device package containing an LD chip.

First Embodiment

Figure 1:
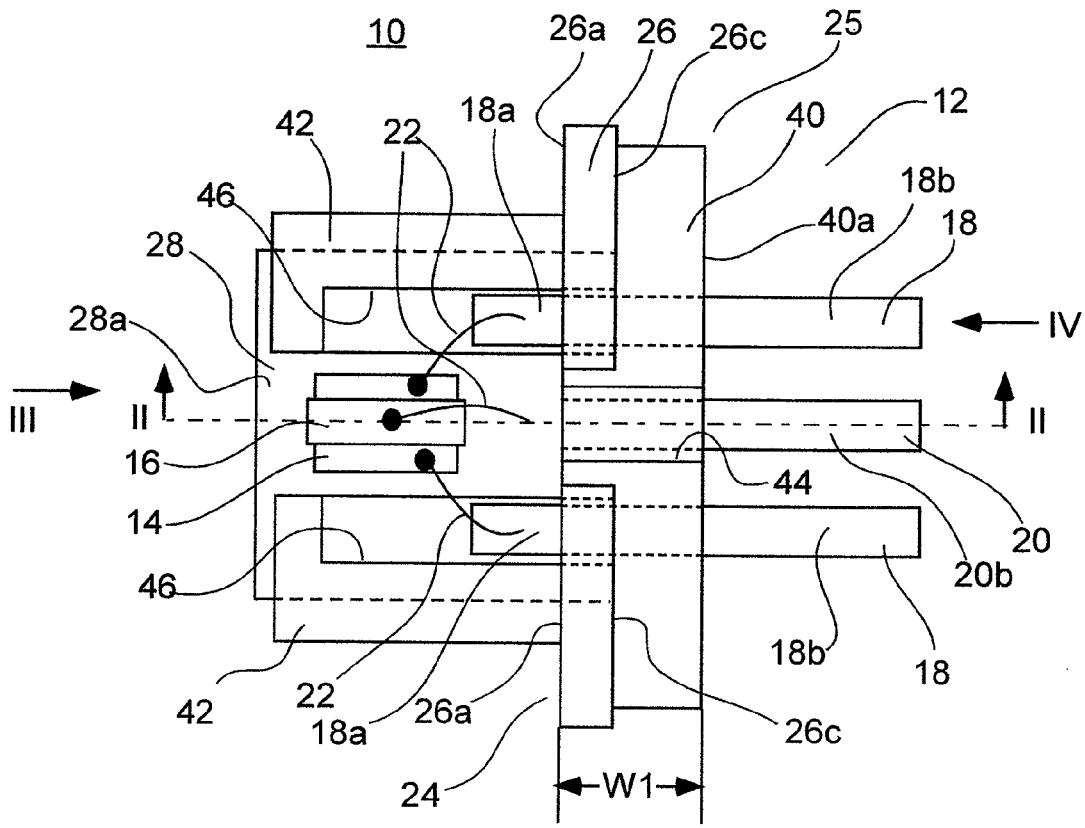
FIG. 1 is a plan view of an LD device according to an embodiment of the present invention.
Figure 2:
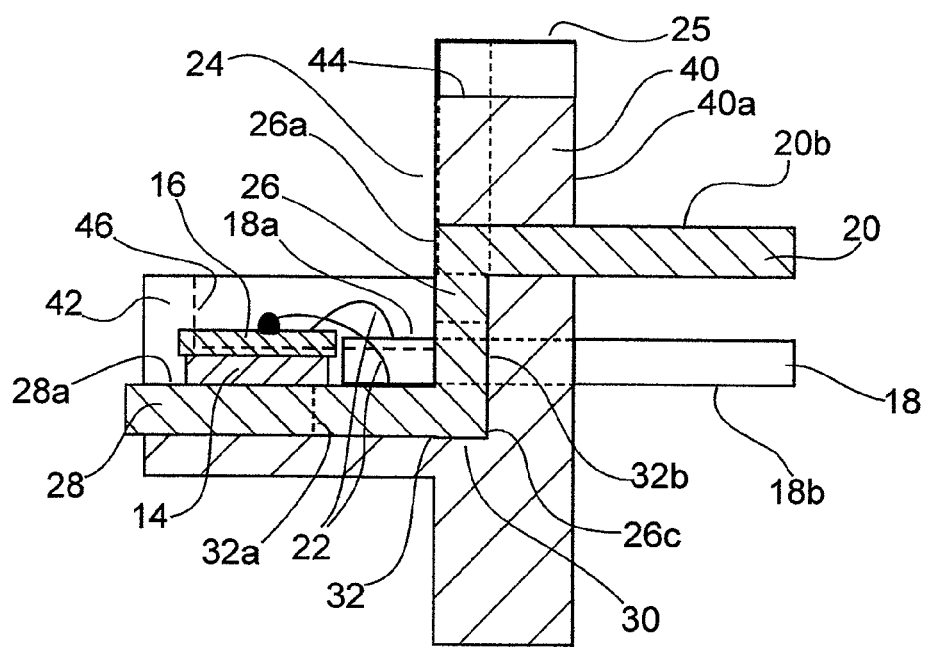
FIG. 2 is a cross-sectional view of the LD device shown in FIG. 1 taken along line II-II as viewed in the direction of the arrows.
Figure 3:
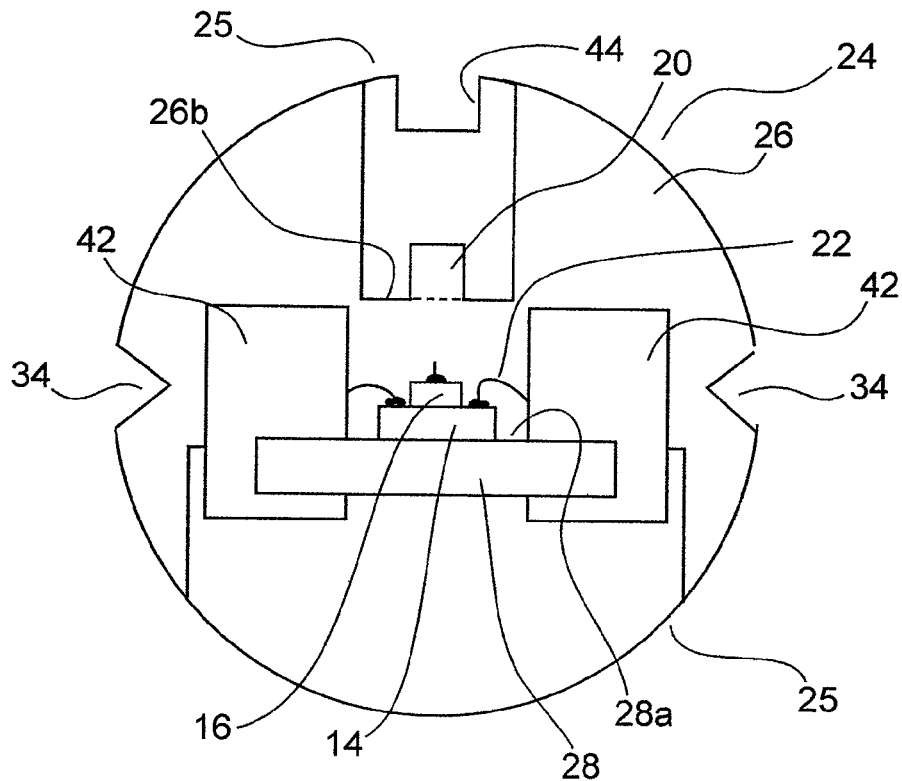
FIG. 3 is an elevation of the LD device shown in FIG. 1 as viewed in the direction of the arrow III.
Figure 4:
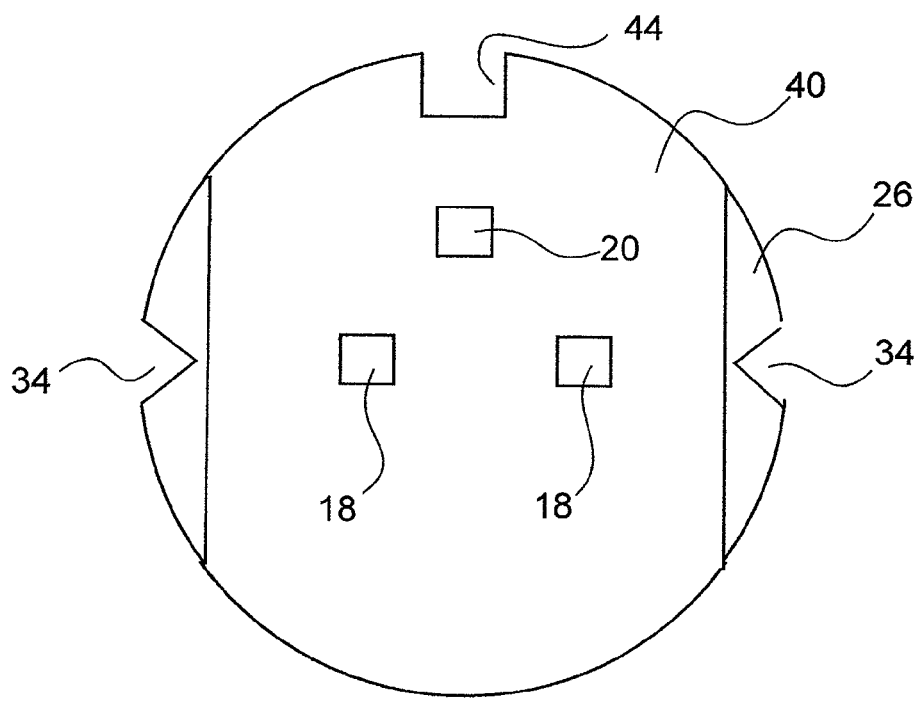
FIG. 4 is a bottom view of the LD device shown in FIG. 1 as viewed in the direction of the arrow IV.
Figure 5:
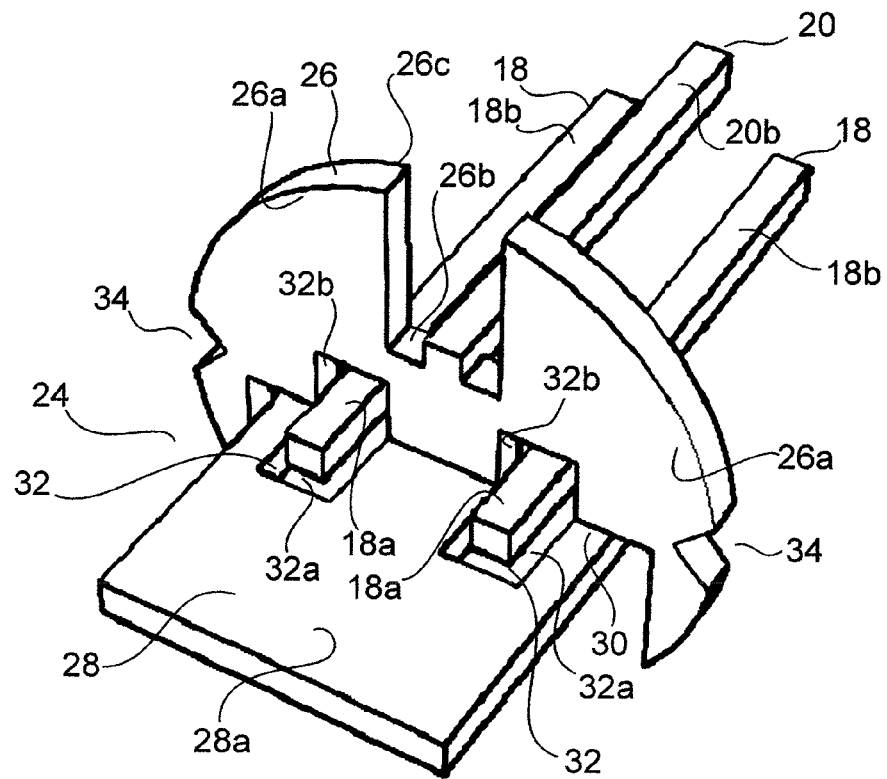
FIG. 5 is a perspective view showing the positional relationship between the metal base and the lead electrodes of the LD device according to an embodiment of the present invention.
Figure 6:
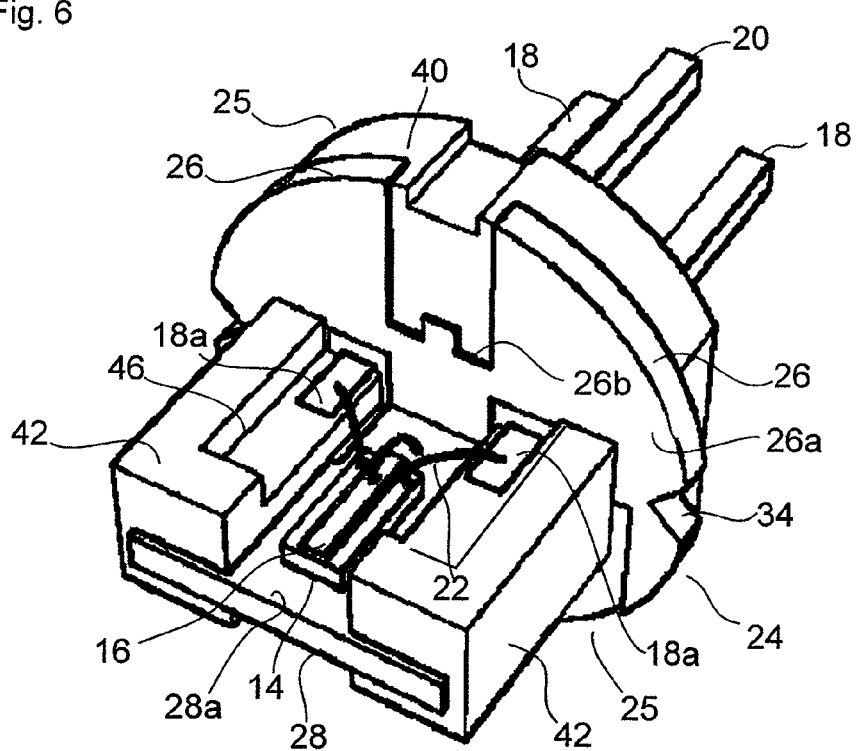
FIG. 6 is a perspective view of the LD device according to one embodiment of the present invention.

FIG. 1 is a plan view of an LD device according to an embodiment of the present invention; FIG. 2 is a cross-sectional view of the LD device shown in FIG. 1 taken along line II-II as viewed in the direction of the arrows; FIG. 3 is an elevation of the LD device shown in FIG. 1 as viewed in the direction of the arrow III; FIG. 4 is a bottom view of the LD device shown in FIG. 1 as viewed in the direction of the arrow IV; FIG. 5 is a perspective view showing the positional relationship between the metal base and the lead electrodes of the LD device according to an embodiment of the present invention; and FIG. 6 is a perspective view of the LD device according to one embodiment of the present invention. It should be noted that in these figures, like numerals are used to denote like or corresponding components.

Referring to FIG. 1, an LD device 10 includes: an LD package 12; an LD chip 16 mounted on a submount 14 disposed on the LD package 12; and wires 22 of, for example, Au connected between the electrodes (not shown) of the LD chip 16 and signal lead pins 18 and a ground lead pin 20 of the LD package 12.

The LD package 12 includes: a metal frame 24 serving as metal base; a molded resin member 25 serving as resin seal member; the signal lead pins 18 serving as a first lead electrode; and the ground lead pin 20 serving as second lead electrode.

The metal frame 24 is made up of a 0.4 mm thick Cu plate plated with, for example, Ag. It should be noted that the metal frame 24 may be plated with Ni/Au or Ni/Pd/Au instead of Ag.

Referring now to FIGS. 2 and 3, the metal frame 24 includes: a substrate 26 having a predetermined outer circumferential shape, e.g., a round shape; and a rectangular die pad portion 28 bent from the substrate 26 such that it forms a predetermined angle, e.g., 90 degrees, with a first principal surface 26a of the substrate 26.

According to the present embodiment, in the manufacturing process of this metal frame 24, the die pad portion 28 is bent to the predetermined angle, e.g. 90 degrees, at once. However, the die pad portion 28 may be bent a plurality of times so as to eventually form that angle.

With the metal frame 24 of the present embodiment, the ground lead pin (or pin-shaped member) 20 is disposed to extend parallel to an extension of the center line of the die pad portion 28 but in the opposite direction as the die pad portion 28, as shown in FIGS. 1 and 2. (The center line of the die pad portion 28 is orthogonal to the bend line between the substrate 26 and the die pad portion 28 and meets the vertical line that extends across the first principal surface 26a of the substrate 26 and that meets the center line of the ground lead pin 20.) Especially, according to the present embodiment, the ground lead pin 20 is formed by bending the same piece of plate material used to form the substrate 26 and the die pad portion 28, and extends from a notched portion 26b cut in the outer circumferential edge of the substrate 26, as shown in FIG. 3. More specifically, the ground lead pin 20 is bent so as to extend parallel to the center line of the die pad portion 28 described above.

Thus, the ground lead pin 20 is formed from the same piece of lead frame material used to form the substrate 26. That is, the substrate 26, the die pad portion 28, and the ground lead pin 20 of the metal frame 24 are integrally formed from the same piece of plate material by a press at once. They are integrally profiled and bent at the same time, resulting in reduced cost (see FIG. 5).

Further, the resin layer partially covering the ground lead pin 20 has a thickness of at most only approximately 1.2 mm. In the case of conventional optical device packages, if the resin layer cannot be formed to a thickness large enough to reliably cover the ground lead pin 20, the ground lead pin 20 must be secured to the notched portion 26b of the substrate 26 by welding or bonding. In the case of the optical device package of the present embodiment, on the other hand, since the ground lead pin 20 and the substrate 26 are formed from the same piece of plate material by bending, not only can the metal frame 24 be manufactured at low cost but the ground lead pin 20 can have the required pullout resistance without increasing the thickness of the resin layer.

Of course, the ground lead pin 20 may be formed from a different piece of plate material than the substrate 26 and may be electrically and mechanically joined to the notched portion 26b of the substrate 26 by welding, etc.

Referring to FIGS. 2 and 5, in the metal frame 24, two lead electrode insertion grooves 32 are formed in the bent portion (or connection portion) 30 between the die pad portion 28 and the substrate 26. Specifically, the lead electrode insertion grooves 32 are disposed along the respective sides of the die pad portion 28 that extends from the substrate 26. Each lead electrode insertion groove 32 includes a die pad groove 32a serving as first opening and a substrate hole 32b, serving as second opening, which is formed in the substrate 26 and connected to the die pad groove 32a. One end of each signal lead pin 18 is inserted into a respective lead electrode insertion groove 32, as shown in FIGS. 1, 2, and 5. More specifically, according to the present embodiment, the end portion of each signal lead pin 18 facing toward the die pad portion 28 is inserted into a respective lead electrode insertion groove 32 and hence protrudes slightly from the first principal surface 26a of the substrate 26 of the metal frame 24.

The portion of each signal lead pin 18 protruding from the first principal surface 26a of the substrate 26 constitutes a bonding pad 18a for an Au wire 22. Further, the other portion of each signal lead pin 18 extends a considerable distance in the opposite direction as the die pad portion 28 and constitutes a substrate insertion portion 18b which is to be inserted into an electrode of a film substrate, or mounting substrate. Further, the portion of the ground lead pin 20 adjacent to or parallel to the substrate insertion portions 18b of the signal lead pins 18 constitutes a substrate insertion portion 20b.

Thus, according to the present embodiment, two lead electrode insertion grooves 32 are formed along the respective sides of the die pad portion 28, and a single straight signal lead pin 18 is inserted into each lead electrode insertion groove 32. However, a plurality of signal lead pins may be inserted into a single lead electrode insertion groove 32.

Further, instead of the straight signal lead pins 18, it is possible to use stepped or "crank-shaped" signal lead pins or those having a projection(s) in order to increase the pullout resistance.

Further, the lead electrode insertion grooves 32 may not include the die pad grooves 32a (i.e., may only include the substrate holes 32b). With this arrangement, the signal lead pins 18 may be inserted into their respective substrate holes 32b, and the portion of each signal lead pin 18 protruding from the substrate hole 32b may constitute a bonding pad 18a.

Further, the metal frame 24 may include neither the die pad grooves 32a (i.e., openings formed along the respective sides of the die pad portion 28) nor the substrate holes 32b. With this arrangement, the signal lead pins 18 may be disposed to extend under the substrate 26 and along the respective sides of the die pad portion 28, protruding from the substrate 26. The portion of each signal lead pin 18 protruding from the substrate 26 may constitute a bonding pad 18a.

Further, the surface of the die pad portion 28 underneath a chip mounting surface 28a shown in FIG. 2 may act as a chip mounting surface instead of the chip mounting surface 28a, and a portion of each signal lead pin 18 may protrude along this chip mounting surface and constitute a bonding pad 18a.

As described above, the optical device package of the present embodiment includes two signal lead pins 18 and one ground lead pin 20. The signal lead pins 18 are spaced and thereby electrically insulated from the metal lead frame 24. The ground lead pin 20 and the metal lead frame 24 are integrally formed from the same piece of plate material (or they may be separately formed from difference pieces of plate material and joined and thereby electrically connected together by welding, etc). However, the present invention is not limited to this particular arrangement. Like the signal lead pins 18, the ground lead pin 20 may be spaced apart from the metal frame 24.

Further, although the optical device package of the present embodiment has been described as including three lead pins (namely, two signal lead pins 18 and one ground lead pin 20), it may include only two signal lead pins 18 and not include the ground lead pin 20, which is formed from the same piece of plate material used to form the metal frame 24 or which is formed from a different piece of plate material than the metal frame 24 and joined to the metal frame 24 by welding, etc. In this case, one of the signal lead pins 18 may act as a ground lead pin.

Referring to FIGS. 3 and 4, side notches 34 are formed in the portions of the outer circumferential edge of the substrate 26 adjacent the respective sides of the die pad portion 28. These side notches 34 are used to hold the package in the assembly process. The horizontal center line of the side notches 34 is located at the same vertical position as the center line of the thickness of the signal lead pins 18 which in turn is located at the same vertical position as the point of light emission in the LD chip 16 mounted on the die pad portion 28. That is, these horizontal center lines and the point of light emission are located in the same plane. Further, the point of light emission of the LD chip 16 is located at the center of the arc-shaped outer circumference of the substrate 26. The outer circumference of the substrate 26 has an arc shape to maintain compatibility with conventional metal stems.

The molded resin member 25 includes a resin base 40 serving as base portion and protective walls 42 serving as sidewall portions, which reliably mechanically secure the metal frame 24, the signal lead pins 18, and the ground lead pin 20 in place, as shown in FIGS. 1, 2, and 6. Further, since the lead electrode insertion grooves 32 are filled and sealed with a resin by a molding process after the signal lead pins 18 are inserted into these grooves, the metal frame 24 and the signal lead pins 18 are further firmly fixed in place by the molded resin in the lead electrode insertion grooves 32.

One surface of the resin base 40 is disposed in close contact with a second principal surface 26c, which faces the first principal surface 26a each other, of the substrate 26 of the metal frame 24, and another surface 40a of the resin base 40, which faces that one surface, is flat and has a predetermined outer circumferential shape including, for example, an arc(s), as shown in FIG. 1. The resin base 40 itself has a disc shape. The combined thickness W1 of the substrate 26 and the resin base 40 is approximately 1.2 mm.

It should be noted that the substrate insertion portions 18b of the signal lead pins 18 and the substrate insertion portion 20b of the ground lead pin 20 protrude from the surface 40a of the resin base 40.

According to the present embodiment, the resin base 40 has an outer shape that includes an arc having the same radius as the outer circumferential shape of the substrate 26 of the metal frame 24. This allows for compatibility with the metal stems of packages having a conventional structure.

According to the present embodiment, the outer circumferences of the substrate 26 and the resin base 40 have the same radius, as described above. However, the outer circumference of the substrate 26 may have a larger radius than the outer circumference of the resin base 40.

Further, it is also acceptable that the outer circumference of the substrate 26 has a smaller radius than the outer circumference of the resin base 40 if that does not affect the amount of shift of the light emission point of the LD due to thermal deformation.

Further, although the substrate 26 of the metal frame 24 and the resin base 40 according to the present embodiment have been described as having an outer circumferential shape including an arc, they may have other outer circumferential shapes. In such a case, it is acceptable that some outer circumferential portions of the resin base 40 are not covered with the substrate 26 if that does not affect the amount of shift of the light emission point of the LD due to thermal deformation.

Further, the substrate 26 and the resin base 40 may have any shape that includes a portion or portions (e.g., notched portions) that allow for compatibility with the stem of a can package to be replaced.

Further, although in the present embodiment the resin base 40 is disposed in close contact with the second principal surface 26c of the substrate 26, the resin base 40 may be disposed in close contact with the first principal surface 26a of the substrate 26 instead.

As shown in FIG. 4, the shape of both side edges of the resin base 40 is a straight line, not an arc, so as not to cover the side notches 34 formed in the outer circumferential edge of the substrate 26 of the metal frame 24, allowing the package to be held by use of these notches in the assembly process. It should be noted that this shape of the side edges of the resin base 40 matches the shape of the resin molding die used.

As described above, the notched portion 26b is cut in the outer circumferential edge of the substrate 26, as shown in FIGS. 1 and 3. The center line of the notched portion 26b coincides with the vertical line that extends across the first principal surface 26a of the substrate 26 and that meets the center line of the die pad portion 28 at a right angle. (The center line of the die pad portion 28 is orthogonal to the bend line between the substrate 26 and the die pad portion 28.) According to the present embodiment, an angle detection notch 44 is formed in the outer circumferential edge of the resin member molded to fill the notched portion 26b.

As shown in FIGS. 1 and 6, the protective walls 42 of the molded resin member 25 are formed to cover the upper and lower surfaces of the respective sides of the die pad portion 28. The middle portion of the die pad portion 28 sandwiched between both protective walls 42 is not covered with a resin, and hence its upper and lower metal surfaces are exposed.

The chip mounting surface 28a is formed on this middle portion of the die pad portion 28 (also see FIGS. 2 and 3), and the LD chip 16 is mounted on the submount 14 disposed on the chip mounting surface 28a. The submount 14 has dimensions of approximately 0.6 mm×1.47 mm×0.24 mm and is formed of, for example, aluminum nitride (AlN). For example, AuSn solder, which has a melting point of 280° C., is used to bond the submount 14 to the die pad portion 28 and to bond the LD chip 16 to the submount 14. Instead of AuSn solder, it is possible to use SnAgCu or SnPb solder or a conductive adhesive such as Ag paste.

The height of the side portions of the protective walls 42 facing toward the chip mounting surface 28*a* (or the LD chip 16) is determined based on the height position of the Au wires 22 connected between the electrodes (not shown) of the LD chip 16 and the ground lead pin 20 and the signal lead pins 18. Specifically, the height of these side portions is set such that their upper surfaces are located at a higher position than the Au wires 22. Therefore, as shown in FIG. 6, a recessed portion 46 is formed in the surface of the side portion of each protective wall 42 facing toward the chip mounting surface 28*a* (or the LD chip 16) to allow the portion of each signal lead pin 18 protruding from the first principal surface 26*a* to be used as a bonding pad (18*a*), that is, to expose that portion of each signal lead pin 18.

It should be noted that although in the present embodiment Au wires are used to connect between the electrodes of the LD chip 16 and the ground lead pin 20 and the signal lead pins 18, Al wires or enamel-coated wires, etc. may be used instead of Au wires.

Further, although in the present embodiment the molded resin member 25 includes the protective walls 42, it may include no protective walls. In such a case, both sides of the die pad portion 28 may be bent erected to face toward the chip mounting face 28*a* (or the LD chip 16) and used as protective walls.

Further, although in the present embodiment the protective walls 42 are formed to cover the upper and lower surfaces of the respective sides of the die pad portion 28, the entire lower surface of the die pad portion 28 (i.e., the surface of the die pad portion 28 on which the chip mounting surface 28*a* is not formed) may be exposed to achieve enhanced heat dissipation characteristics.

The molded resin member 25 is formed using the following steps: inserting and positioning the signal lead pins 18 in the lead electrode insertion grooves 32 of the metal frame 24; placing the metal frame 24 in a molding die; and introducing, for example, a liquid crystal polymer into the die. Through this die casting process, the resin base 40 and the protective walls 42 are integrally formed and the metal frame 24 and the signal lead pins 18 are reliably mechanically fixed in place relative to each other by the resin securely adhered to portions of the metal frame 24 and the signal lead pins 18, such as: the second principal surface 26*c* of the substrate 26; the notched portion 26*b* cut in the outer circumferential edge of the substrate 26; the lead electrode insertion grooves 32; the side edges of the die pad portion 28; and the outer circumferential surfaces of the signal lead pins 18.

It should be noted that although the present embodiment uses a liquid crystal polymer as the molded resin member 25, it is possible to use a thermoplastic resin for injection molding, such as PPS, a resin for transfer molding, or low melting point glass for sealing/bonding, etc., instead of the liquid crystal polymer.

Figure 7:
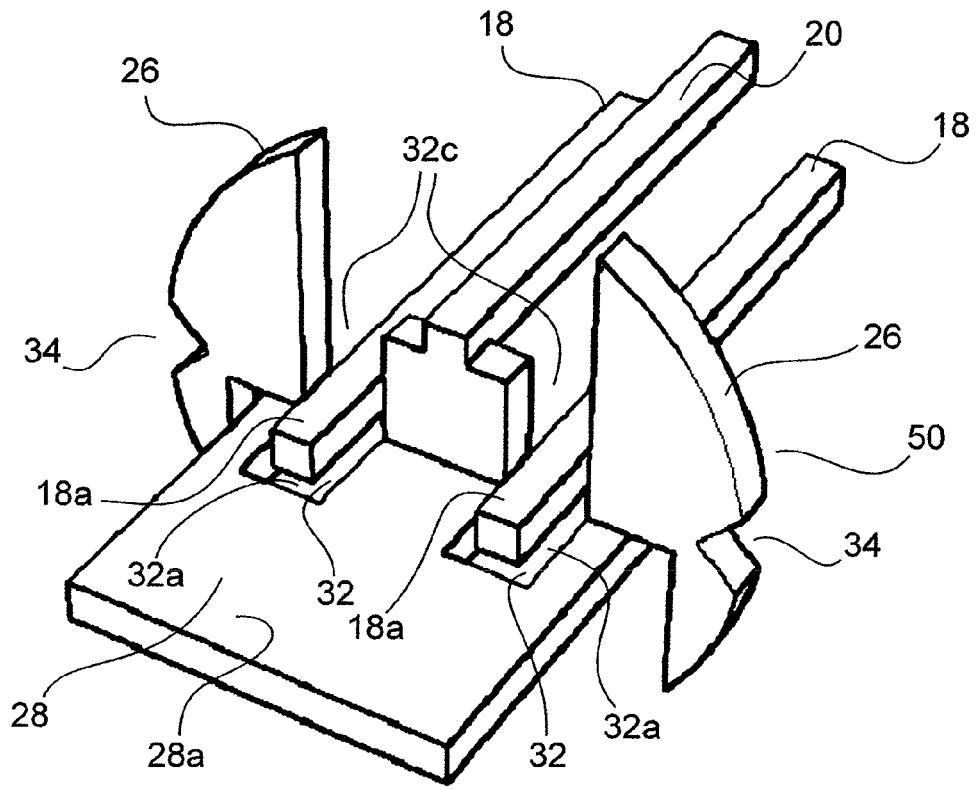
FIG. 7 is a perspective view showing the positional relationship between a metal base and the lead electrodes in a variation according to an embodiment of the present invention.

FIG. 7 is a perspective view showing the positional relationship between a metal base and the lead electrodes in a variation according to an embodiment of the present invention.

Each lead electrode insertion groove 32 of a metal frame 50 shown in FIG. 7 is formed on a respective side of the die pad portion 28 and includes: a die pad groove 32*a* formed along a respective side of the die pad portion 28; and a slit 32*c*, serving as second opening, formed in the substrate 26 and integrally connected to the die pad groove 32*a*. In the case of the metal frame 24 described above, substrate holes 32*b*, which are through-holes, are formed in the substrate 26 such that they are integrally connected to respective die pad grooves 32*a*. In the case of the metal frame 50, on the other hand, rectangular notch-shaped slits 32*c* having the same width as the die pad grooves 32*a* extend from the outer circumferential edge of the substrate 26 to respective die pad grooves 32*a*. Since the metal frame 50 has such a shape, the signal lead pins 18 inserted into the lead electrode insertion grooves 32 can be formed from the same piece of plate material as the metal frame 50, resulting in further reduced cost.

Figure 8:
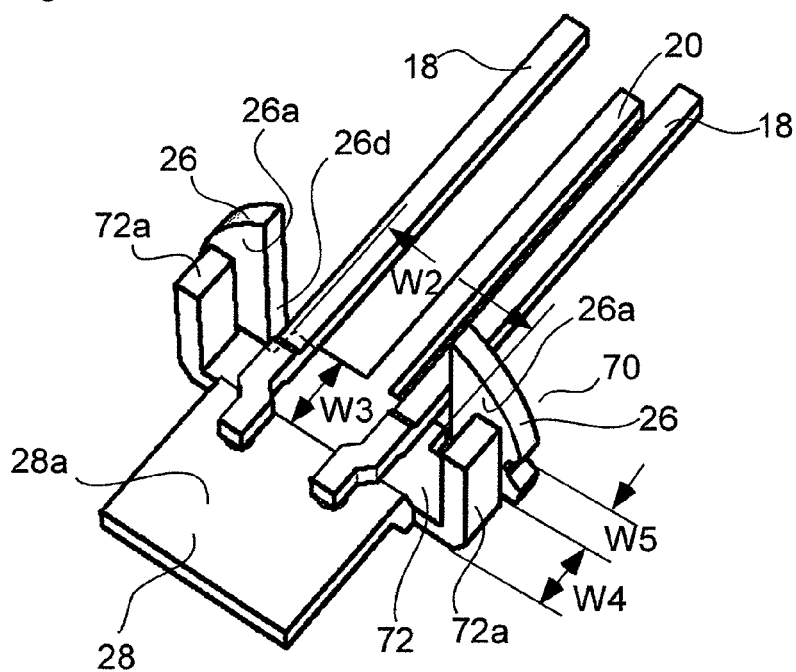
FIG. 8 is a perspective view showing a positional relationship between a metal base and the lead electrodes in a variation of according to an embodiment of the present invention.

FIG. 8 is a perspective view showing a positional relationship between a metal base and the lead electrodes in a variation of according to an embodiment of the present invention.

Referring to FIG. 8, a metal frame 70 has no lead electrode insertion grooves. Instead, a die pad extension 72 is formed to extend from the die pad portion 28 to the substrate 26, as shown in FIG. 8. The width of the die pad extension 72 is approximately equal to the thickness of the resin base 40. The die pad extension 72 and the die pad portion 28 share the same plane. Further, wings 72*a* are provided at the respective side edges of the die pad extension 72. Specifically, the wings 72*a* are formed by bending both sides of the die pad extension 72 such that they are erected to face toward the chip mounting surface 28*a* (or the LD chip 16). The substrate 26 extends along one side of the chip mounting surface 28*a* and faces toward each wing 72*a*, as shown in FIG. 8. A notched portion 26*d* is formed in a middle portion of the substrate 26 so as to extend from the outer circumferential edge of the substrate 26 to the surface of the die pad extension 72. A ground lead pin 20 is provided at the center of the edge portion of the die pad extension 72 defined by the notched portion 26*d*. The ground lead pin 20, the die pad portion 28, and the die pad extension 72 are integrally formed from the same piece of plate material. They share the same plane. The ground lead pin 20 extends in a straight line from the die pad extension 72. More specifically, the ground lead pin 20 and the die pad portion 28 extend in opposite directions.

The edge portions, which cross-sectional areas, of the die pad extension 72 on both sides of the ground lead pin 20 are exposed to the atmosphere even if the resin base 40 is molded so as to cover the upper and lower surfaces of the die pad extension 72. The width denoted by W2 in FIG. 8 is approximately 150% or more of the width of the ground lead pin 20. This enhances the heat dissipation characteristics of the package, resulting in increased pullout resistance of the lead pins.

Two signal lead pins 18 are disposed to extend along the respective sides of the ground lead pin 20. One end of each signal lead pin 18 partially overlaps the upper surfaces of the die pad extension 72 and the die pad portion 28. It should be noted that the signal lead pins 18 are spaced apart from the die pad extension 72 and the die pad portion 28. Further, the portions of the signal lead pins 18 overlapping the die pad extension 72 and the die pad portion 28 are not straight and have a step shape or "crank shape" to increase the pullout resistance of these lead pins.

Figure 9:
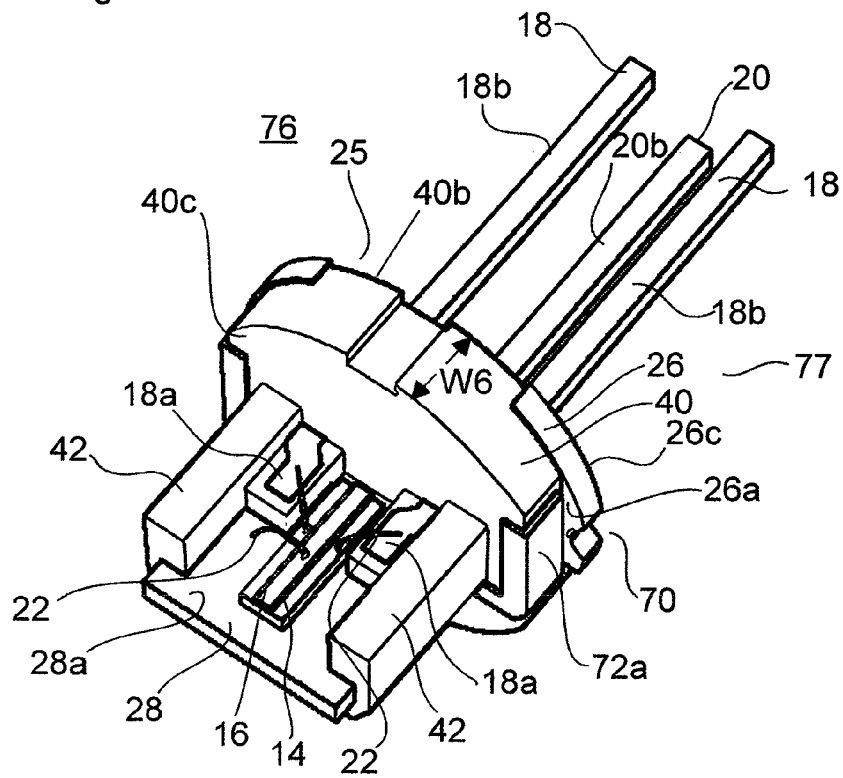
FIG. 9 is a perspective view of an LD device employing the metal frame 70 according to an embodiment of the present invention.

FIG. 9 is a perspective view of an LD device employing the metal frame 70 according to an embodiment of the present invention.

Referring to FIG. 9, an LD package 77 in an LD device 76 includes the metal frame 70 and the signal lead pins 18 shown in FIG. 8. A molded resin member 25 includes a resin base 40 and protective walls 42 which reliably mechanically secure the metal frame 70 and the signal lead pins 18 in place, as in the LD package 12.

The resin base 40 is formed on the first principal surface 26a side of the substrate 26 such that the resin base 40 is in close contact with the first principal surface 26a and covers portions of the signal lead pins 18 and the upper and lower surfaces of the die pad extension 72. However, the edge portions of the die pad extension 72 on both sides of the ground lead pin 20 are not covered with the resin material and hence are exposed.

Referring to FIGS. 8 and 9, the maximum width W3 of the die pad extension 72 is approximately equal to the sum of the width W4 of the wings 72a and the thickness W5 of the substrate 26, and also approximately equal to the maximum width W6 of the resin base 40. This arrangement allows the substrate 26 and the sides of the wings 72a to partially cover the principal surfaces of the disc-shaped resin base 40, preventing deformation of the resin base 40.

Further, the wings 72a, which are made of a metal, covers the outer circumferential surface of the resin base 40, thereby preventing its deformation. This also allows for a reduction in the profile irregularities, resulting in increased positioning accuracy.

The second principal surface 26c of the substrate 26 and a surface 40b of the resin base 40 adjacent to the second principal surface 26c share substantially the same plane. The signal lead pins 18 and the ground lead pin 20 protrude from the flat surface 40b of the resin base 40, and the protruding portions of the signal lead pins 18 and the ground lead pin 20 constitute substrate insertion portions 18b and a substrate insertion portion 20b, respectively.

One end of each signal lead pin 18 protrudes from the other surface (40c) of the resin base 40 which faces toward the die pad portion 28. This protruding portion constitutes a bonding pad 18a.

A chip mounting surface 28a is formed on a middle portion of the die pad portion 28, and an LD chip 16 is mounted on a submount 14 disposed on the chip mounting surface 28a. The electrodes of the LD chip 16 are connected to the chip mounting surface 28a, which are connected to the ground lead pin 20, and the bonding pads 18a by Au wires 22, as in the LD device 10.

Figure 11:
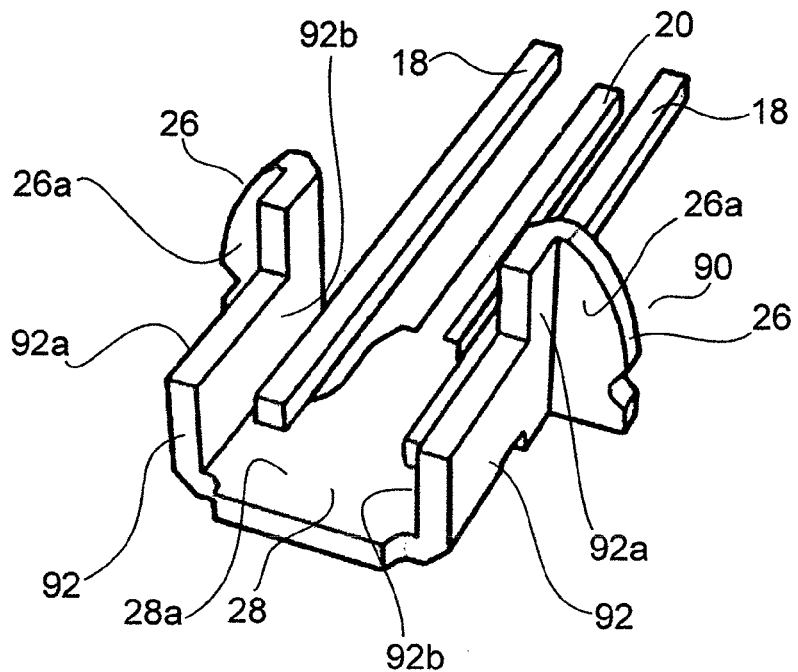
FIG. 11 is a perspective view showing the positional relationship between the metal base and the lead electrodes in another variation according to an embodiment of the present invention.

FIG. 11 is a perspective view showing the positional relationship between the metal base and the lead electrodes in another variation according to an embodiment of the present invention.

Referring to FIG. 11, in a metal frame 90, wings 92, serving as protrusions, are provided which extend along substantially the entire portions of the respective side edges of the die pad portion 28. Specifically, the wings 92 are formed by bending both sides of the die pad portion 28 such that they are erected to face toward the chip mounting surface 28a (or the LD chip 16), as shown in FIG. 11. For example, the wings 92 and the chip mounting surface 28a form an angle of 90 degrees.

The ground lead pin 20 and the die pad portion 28 are integrally formed from the same piece of plate material and share the same plane. The ground lead pin 20 extends substantially along the center line of the die pad portion 28.

As shown in FIG. 11, both side portions of the die pad portion 28 are partially notched. Therefore, the length of the portions of the wings 92 connected to the die pad portion 28 is shorter than the length of the middle portion of the die pad portion 28 extending from the edge of the die pad portion 28 to the ground lead pin 20. However, since the entire length of the wings 92 is approximately equal to the length of the middle portion of the die pad portion 28, portions of the wings 92 protrude and extend parallel to the ground lead pin 20.

A substrate 26, which is made up of two separate portions, is connected to the protruding edge portions of the wings 92. The substrate 26 extends outward from these protruding edge portions. The outer sides 92a of the wings 92 and the first principal surface 26a of the substrate 26 form an angle of, for example, 90 degrees.

In the metal frame 70 shown in FIG. 8, the wings 72a are formed by bending both sides of the die bad extension 72 such that they are erected to face toward the chip mounting surface 28a (or the LD chip 16). The substrate 26 extends along one side of the chip mounting surface 28a and faces toward each wing 72a of the die pad extension 72. That is, the wings 72a are connected to the substrate 26 through the die pad extension 72.

In the case of the metal frame 90 shown in FIG. 11, on the other hand, the substrate 26 is integrally connected to the protruding edge portions of the wings 92 which in turn are integrally connected to the die pad portion 28.

Further, the ground lead pin 20 and the die pad portion 28 extend in a straight line in opposite directions. Two signal lead pins 18 are disposed to extend along the respective sides of the ground lead pin 20.

One end of each signal lead pin 18 partially overlaps the upper surface of the die pad portion 28 and extends along the inner sides 92b of the wings 92. That is, these signal lead pins 18 protrude from both principal surfaces of the substrate 26.

It should be noted that the signal lead pins 18 are spaced apart from the die pad portion 28. Further, although in FIG. 11 the signal lead pins 18 has a straight configuration, they may have a step shape or "crank shape" to provide increased pullout resistance, as in FIG. 8.

The metal frame 90, configured as described above, can be manufactured by forming the die pad portion 28, both wings 92, and the substrate 26 from the same piece of metal plate material by punching and bending, resulting in reduced manufacturing cost, as compared to casting and forging.

Further, since both side edges of the die pad portion 28 are partially notched, an efficient blank layout can be designed for the signal lead pins 18 and the ground lead pin 20 by utilizing these notched portions, thereby saving material.

Further, since the die pad portion 28 has the wings 92 on both sides, it has enhanced flexural rigidity, which prevents heat deformation of the die pad portion 28 in heating.

Figure 12:
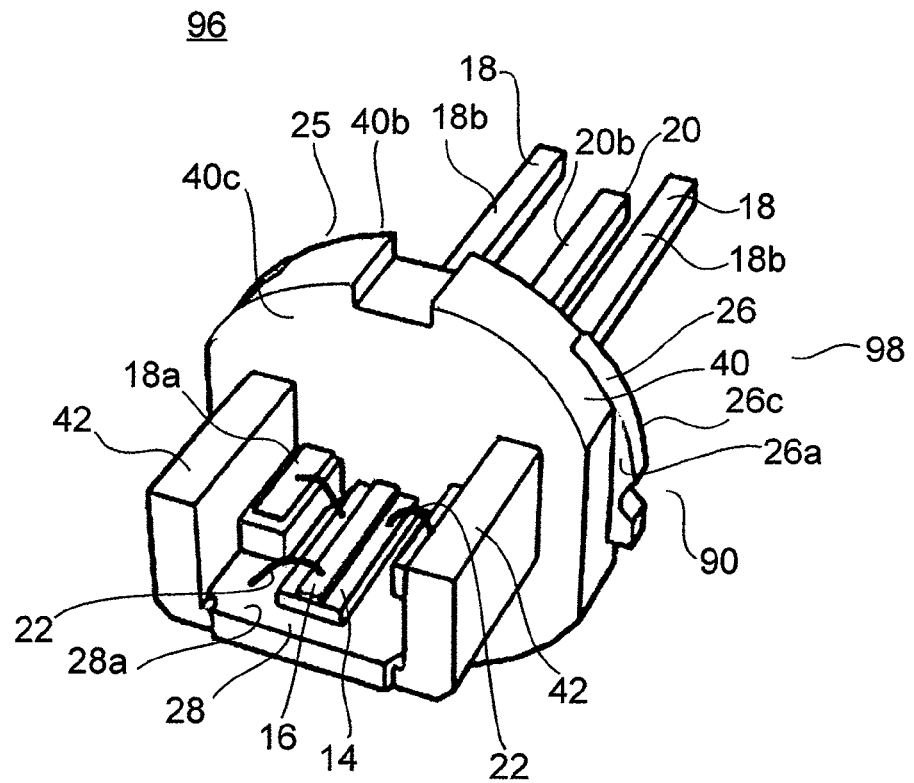
FIG. 12 is a perspective view of an LD device according to an embodiment of the present invention.

FIG. 12 is a perspective view of an LD device according to an embodiment of the present invention.

Referring to FIG. 12, an LD package 98 in an LD device 96 includes the metal frame 90 and the signal lead pins 18 shown in FIG. 11. A molded resin member 25 includes a resin base 40 and protective walls 42 which are formed to cover the wings 92. The lower surface of the die pad portion 28 (i.e., the surface of the die pad portion 28 on which the chip mounting surface 28a is not formed) is also covered with the molded resin member 25. The molded resin member 25 reliably mechanically secures the metal frame 90 and the signal lead pins 18 in place, as in the LD package 12.

Thus, in the LD device 96 of the present embodiment, the lower surface of the die pad portion 28 (i.e., the surface of the die pad portion 28 on which the chip mounting surface 28a is not formed) is covered with a resin. However, the lower surface of the die pad portion 28 may be exposed to the atmosphere, since the die pad portion 28 has the wings 92 on both sides, which enhances the flexural rigidity of the die pad portion 28 and hence may eliminate the need to attach resin projections to the lower surface of the die pad portion 28.

Exposing the lower surface of the die pad portion 28 to the atmosphere allows the heat dissipation characteristics of the package to be enhanced.

Further, although in the LD device 96 of the present embodiment the wings 92 are entirely covered with a resin, some portions of the wings 92 may be exposed to effectively dissipate heat from the LD chip 16.

Further, although in the LD device 96 of the present embodiment the die pad portion 28 has a rectangular shape, it may have a trapezoidal shape that widens toward the substrate 26 side to enhance the heat dissipation characteristics of the package.

The resin base 40 is formed on the first principal surface side 26a side of the substrate 26 such that the resin base 40 is in close contact with the first principal surface 26a and covers portions of the wings 92 and the two signal lead pins 18. However, the edge portions on both sides of the ground lead pin 20 are not covered with the resin material and hence are exposed, as described above.

The second principal surface 26c of the substrate 26 and a surface 40b of the resin base 40 adjacent to the second principal surface 26c share substantially the same plane. The signal lead pins 18 and the ground lead pin 20 protrude from the flat surface 40b of the resin base 40, and the protruding portions of the signal lead pins 18 and the ground lead pin 20 constitute substrate insertion portions 18b and a substrate insertion portion 20b, respectively.

One end of each signal lead pin 18 protrudes from the other surface (40c) of the resin base 40 which faces toward the die pad portion 28. This protruding portion constitutes a bonding pad 18a.

A chip mounting surface 28a is formed on a middle portion of the die pad portion 28, and an LD chip 16 is mounted on a submount 14 disposed on the chip mounting surface 28a. The electrodes of the LD chip 16 are connected to the chip mounting surface 28a, which are connected to the ground lead pin 20, and the bonding pads 18a by Au wires 22, as in the LD device 10.

In the LD device 96 of the present embodiment, the substrate 26 is integrally connected to the protruding edge portions of the wings 92 which in turn are integrally connected to the die pad portion 28, forming a heat conducting path. Since the second principal surface 26c of the substrate 26 is exposed to the atmosphere, the heat generated from the LD chip 16 is conducted from the die pad portion 28 to the substrate 26 through the above heat conducting path and efficiently dissipated from the substrate 26.

Figure 10:
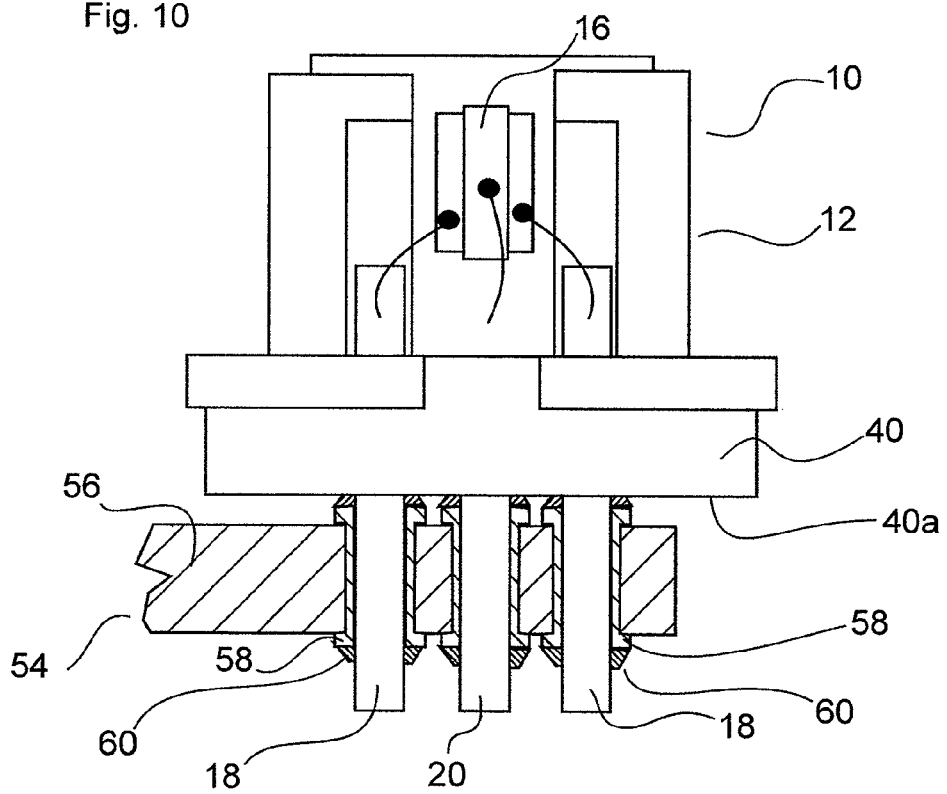
FIG. 10 is a partial cross-sectional schematic view showing an LD device mounted on a mounting substrate according to an embodiment of the present invention.

FIG. 10 is a partial cross-sectional schematic view showing an LD device mounted on a mounting substrate according to an embodiment of the present invention.

Referring to FIG. 10, the signal lead pins 18 and the ground lead pin 20 of the LD device 10 are inserted in a mounting substrate, for example a flexible substrate 54. The flexible substrate 54 is made up primarily of a substrate film 56 of polyimide having a wiring layer (not shown) formed on a surface thereof. FIG. 10 shows a cross-section of a portion of the flexible substrate 54.

Through-holes 58 are formed in the substrate film 56 and connected to the wiring layer. The signal lead pins 18 and the ground lead pin 20 are inserted into these through-holes 58 and bonded thereto by solder 60.

After thus bonding the signal lead pins 18 and the ground lead pin 20 to the through-holes 58 by solder, the portions of these lead pins sticking out of the undersurface of the flexible substrate 54 are cut off.

The mounted LD device 10 has a flat surface 40a, since the resin base 40 making up its LD package 12 has a disc shape.

Since the signal lead pins 18 and the ground lead pin 20 protrude directly from this flat surface 40a of the resin base 40, the flexible substrate 54 can be brought into close contact with the surface 40a.

Therefore, the distance between the LD chip 16 in the LD device 10 and the wiring layer of the flexible substrate 54 can be reduced to reduce inductance, as compared to conventional packages, making it easy to optimize the impedance of this circuit portion. As a result, it is possible to enhance the high frequency characteristics of the LD device 10 employing the LD package 12.

It should be noted that although the arrangement shown FIG. 10 has been described in connection with the LD device 10, the LD devices 76 and 96 can also be used to provide the effect described above.

Thus, the LD package 12, configured as described above, can be disposed on the flexible substrate 54 such that the surface 40a of the resin base 40 is in close contact with the flexible substrate 54, allowing for a reduction in the distance between the LD chip 16 and the flexible substrate 54 and hence a reduction in the inductance. This makes it easy to optimize the impedance of this circuit portion. As a result, it is possible to enhance the high frequency characteristics of the LD device 10.

Further, the metal frame 24 or 50 (which includes the substrate 26 and the die pad portion 28 that is connected to and extends perpendicular to the substrate 26) can be integrally formed by punching and bending a single piece of metal plate material using a press, resulting in reduced manufacturing cost, as compared to casting and forging.

Further, the metal frames 24 and 50 can provide an increased cooling area for effectively dissipating heat from the LD chip 16 die-bonded to the die pad portion 28, thereby limiting the increase of the temperature of the LD device 10.

Further, the molded resin member 25 including the resin base 40 and the protective walls 42 reliably mechanically secures the metal frame 24, the ground lead pin 20, and the signal lead pins 18 in place. In addition, the signal lead pins 18 are inserted into the lead electrode insertion grooves 32 of the metal frame 24 which are then filled and sealed with a resin, allowing the metal frame 24 and the signal lead pins 18 to be firmly fixed in place. Therefore, these lead pins can have high pullout resistance even at high temperatures.

Further, since the LD package 12 is molded of a resin, it can be formed to have a shape that allows for reduced cost and increased design freedom.

Further, the substrate 26 of the metal frame 24 and the resin base 40 may have an outer circumferential shape that includes an arc to maintain compatibility with the metal stems of packages having a conventional structure.

Further, in the LD package 12, the substrate 26 of the metal frame 24 and the resin base 40 form an eyelet portion. In the case of a conventional eyelet, which is made up of only a molded resin member, the eyelet tends to suffer deformation at high temperatures when it is held or handled in the assembly process, which may make it difficult to accurately position the package in a product. In the case of the LD package 12, on the other hand, since its eyelet portion includes the substrate 26 of a metal, the package can be accurately positioned.

Further, when the eyelet portion is made up of only a molded resin member, if the die bonding device used is of the type that solder-bonds the die pad portion by applying heat through the resin base, it may take time to achieve an appropriate level of solder bonding since the low thermal conductivity of the resin base reduces the heat transmission and hence may limit the increase of the temperature of the die pad portion. In the case of the LD package 12, on the other hand, since its eyelet portion includes the metal substrate 26, the die pad portion can be effectively heated, resulting in reduced time for solder die bonding.

Further, when the eyelet portion is made up of only a molded resin member, if the wire bonding is performed by applying ultrasonic energy through the resin base, it may be difficult to achieve an appropriate level of solder bonding since the resin base significantly attenuates the ultrasonic energy. In the case of the LD package 12, on the other hand, since its eyelet portion includes the metal substrate 26, the applied ultrasonic energy can be propagated with little attenuation when bonding wires, resulting in an efficient wire bonding process.

Further, when the eyelet portion is made up of only a molded resin member, the shape of the notched portions formed in the resin base (or the eyelet portion) to hold the package may be restricted depending on setting the draft side of dies when the resin base is molded in dies. In the case of the LD package 12, on the other hand, since its eyelet portion includes the metal substrate 26, side notches (34) can be formed in this substrate, providing greater freedom in setting the draft side of dies.

Thus, since the eyelet portion of the LD package 12 is made up of the substrate 26 of the metal frame 24 and the resin base 40, the manufacturing cost of the LD package 12 can be reduced, as compared to when the eyelet portion is made up of only a molded resin member.

Although the advantages of the present embodiment have been described with reference to the LD package 12, such advantages can also be achieved by use of the LD packages 77 or 98.

As described above, an optical device package according to the present invention comprises: a metal base having a substrate with a predetermined outer shape and a die pad portion integrally connected to the substrate, the substrate and the die pad portion being constructed of a metal plate, the substrate having two principal surfaces, and the die pad portion being bent at a predetermined angle to the principal surfaces of the substrate; a first lead electrode intersecting the principal surfaces of the substrate of the metal base at a predetermined angle, being apart from the metal base, and each end of the first lead electrode protruding from a respective one of the principal surfaces of the substrate; and a resin seal member having a plate-like base portion extending across and in close contact with one of the principal surfaces of the substrate of the metal base, the first lead electrode in the opposite direction as the die pad portion relative to the substrate protruding from the base portion, the resin seal member covering the first lead electrode in the same direction as the die pad portion relative to the substrate leaving a exposed surface portion, and securing the metal base and said first lead electrode.

Accordingly, this optical device package has the following advantages. The metal base including the die pad portion has good heat dissipation characteristics, resulting in reduced degradation of the optical characteristics of the optical device during operation. Further, since the base portion of the resin seal member has a plate-like shape and the first lead electrodes protrude from a surface of this base portion of the resin seal member, the optical device package can be mounted on a mounting substrate such that the mounting substrate is in close contact with the surface of the base portion of the resin seal member. This reduces the distance between the mounting substrate and the optical device mounted on the die pad portion of the metal base, resulting in enhanced high frequency characteristics. Further, this optical device package can be manufactured at low cost, since it employs a resin mold, or a resin seal member.

Since the optical device package according to the present invention further comprises: a lead electrode insertion groove located at the connection portion between the die pad portion and the substrate of the metal base, the lead electrode insertion groove including; a first opening extending along a side of the die pad portion, and a second opening continuing to the first opening and extending through the principal surfaces of the substrate; wherein an end of the first lead electrode is disposed in the lead electrode insertion groove, the first lead electrodes and the metal base are further firmly fixed in place by the portions of the resin seal member molded to fill the lead electrode insertion grooves, resulting in increased pullout resistance of the first lead electrodes from the resin seal member at high temperatures.

Since the optical device package according to the present invention further comprises: protrusions extending along the respective sides of the die pad portion of the metal base, wherein the die pad portion is integrally connected to the substrate of the metal base through the protrusions, this arrangement enhances the flexural rigidity of the die pad portion and hence prevents its deformation due to heat. Accordingly this arrangement also provides a good heat conducting path between the die pad portion and the substrate.

In the optical device package according to the present invention, since either the substrate of the metal base or the base portion of the resin seal member has an outer circumferential shape including an arc, this allows for compatibility with the metal stems having a conventional structure.

In the optical device package according to the present invention, since the base portion of the resin seal member has the same outer circumferential shape as the substrate of the metal base, and the outer circumference of the base portion of the resin seal member coincides with or is located within the outer circumference of the substrate of the metal base, this reduces a change in the position of the optical device relative to the external optical system due to a temperature increase during operation.

Since the optical device package according to the present invention further comprises: sidewall portions with a predetermined thickness integrally connected to the base portion of said resin seal member, wherein the sidewall portions extend along the respective sides of the die pad portion of the metal base without covering a surface of a middle portion of the die pad portion and the exposed surface portion of the first lead electrode, the resin seal member is further firmly attached to the metal base, thereby reliably mechanically securing these components and the first lead electrodes in place.

Since the optical device package according to the present invention further comprises: a second lead electrode intersecting the principal surfaces of the substrate of the metal base at a predetermined angle, protruding from one of the principal surfaces of the substrate of the metal base, extending in the opposite direction as the die pad portion of the metal base relative to the substrate and being electrically connected to the metal base, the metal base and the second lead electrode can be maintained at the same potential.

In the optical device package according to the present invention, since the second lead electrode and the substrate of the metal base are integrally formed from a metal plate, this arrangement allows the metal base and the second lead electrode to be further firmly secured in place, as well as allowing for further reduced manufacturing cost.

An optical semiconductor device according to the present invention comprises: an optical device package including; a metal base having a substrate with a predetermined outer shape and a die pad portion integrally connected to the substrate, the substrate and the die pad portion being constructed of a metal plate, the substrate having two principal surfaces, and the die pad portion being bent at a predetermined angle to the principal surfaces of the substrate, a first lead electrode intersecting the principal surfaces of the substrate of the metal base at a predetermined angle, being apart from the metal base, and each end of the first lead electrode protruding from a respective one of the principal surfaces of the substrate, and a resin seal member having a plate-like base portion extending across and in close contact with one of the principal surfaces of the substrate of said metal base, said first lead electrode in the opposite direction as the die pad portion relative to the substrate protruding from the base portion, the resin seal member covering the first lead electrode in the same direction as the die pad portion relative to the substrate leaving a exposed surface portion, and securing the metal base and the first lead electrode; and a semiconductor laser device mounted on a mount disposed on the surface of the die pad portion of the metal base, and having predetermined electrodes electrically connected to the first lead electrodes or both the first and second lead electrodes.

Accordingly, The above beneficial characteristics of the optical device package contribute to enhancing characteristics of this optical semiconductor device. As a result, the optical semiconductor device is low in cost, yet exhibits good characteristics and reduced transmission loss at high frequencies.

The optical semiconductor device according to the present invention comprises: the optical device package further including, protrusions extending along the respective sides of the die pad portion of said metal base, the die pad portion being integrally connected to the substrate of said metal base through the protrusions.

Accordingly, the optical semiconductor device enhances the reliability for deformation due to heat.

Thus, these optical semiconductor packages and optical semiconductor devices of the present invention are suitable for use in electronic information devices and information communication devices.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. An optical device package comprising:
   a metal base including a substrate with a predetermined outer shape, a die pad portion connected to the substrate, and protrusions extending along respective sides of the die pad portion, wherein
      the substrate, the die pad portion, and the protrusions are a single piece of a metal plate,
      the substrate has two opposed principal surfaces,
      the die pad portion is bent with respect to and is transverse to the two opposed principal surfaces of the substrate, and
      the die pad portion is connected to the substrate of the metal base through the protrusions;
   a first lead electrode intersecting and transverse to the two opposed principal surfaces of the substrate of the metal base; and
   a resin seal member including a plate-like base portion fixed to the die pad portion, wherein
      a principal surface of the base portion extends across and along one of the two opposed principal surfaces of the substrate of the metal base, and
      the first lead electrode protrudes in two directions from the base portion, relative to the direction that the substrate protrudes from the base portion.

2. The optical device package according to claim 1, further comprising a second lead electrode transverse to the two opposed principal surfaces of the substrate of the metal base, protruding from one of the two opposed principal surfaces of the substrate of the metal base, extending in an opposite direction from the die pad portion of the metal base relative to the substrate, and being electrically connected to the metal base.

3. The optical device package according to claim 2, wherein the second lead electrode and the substrate of the metal base are parts of a single metal plate.

4. An optical semiconductor device comprising:
   an optical device package including:
      a metal base including a substrate with a predetermined outer shape, a die pad portion connected to the substrate, and protrusions extending along respective sides of the die pad portion, wherein
         the substrate, the die pad portion, and the protrusions are a single piece of a metal plate,
         the substrate has two opposed principal surfaces,
         the die pad portion is bent with respect to and is transverse to the two opposed principal surfaces of the substrate, and
         the die pad portion is connected to the substrate of the metal base through the protrusions;
      a first lead electrode intersecting and transverse to the two opposed principal surfaces of the substrate of the metal base, and
      a resin seal member including a plate-like base portion fixed to the die pad portion, wherein
         a principal surface of the base portion extends across and along one of the two opposed principal surfaces of the substrate of the metal base, and
         the first lead electrode protrudes in two directions from the base portion, relative to the direction that the substrate protrudes from the base portion; and
   a semiconductor laser device mounted on a mount disposed between the protrusions on a surface of the die pad portion of the metal base, and having an electrode electrically connected to the first lead electrode.

* * * * *